US006162585A

United States Patent [19]

Zhang et al.

[11] Patent Number: 6,162,585

[45] Date of Patent: Dec. 19, 2000

[54] POLYIMIDE AS A MASK IN VAPOR HYDROGEN FLUORIDE ETCHING

[75] Inventors: Tianhong Zhang, Boise; John K. Lee, Meridian, both of Id.

[73] Assignee: Micron Technology, Inc., Boise, Id.

[21] Appl. No.: 09/108,713

[22] Filed: Jul. 1, 1998

Related U.S. Application Data

[62] Division of application No. 08/773,272, Dec. 23, 1996.

[51] Int. Cl.[7] .......... G03C 5/00; G03F 7/26

[52] U.S. Cl. .......... 430/313; 430/317; 216/58

[58] Field of Search .......... 430/313, 314, 430/316, 317; 216/58, 64

[56] References Cited

U.S. PATENT DOCUMENTS

| | | | |
|---|---|---|---|
| 4,040,897 | 8/1977 | Blish, II et al. | 156/656 |
| 4,127,437 | 11/1978 | Bersin et al. | 156/635 |
| 4,749,440 | 6/1988 | Blackwood et al. | 156/646 |
| 4,835,120 | 5/1989 | Mallik et al. | 437/209 |
| 4,904,338 | 2/1990 | Kozicki | 156/628 |
| 5,173,152 | 12/1992 | Tanaka | 156/646 |
| 5,229,331 | 7/1993 | Doan et al. | 437/228 |
| 5,286,679 | 2/1994 | Farnworth | 437/209 |
| 5,302,238 | 4/1994 | Roe et al. | 156/643 |
| 5,310,626 | 5/1994 | Fernandes et al. | 430/327 |
| 5,628,661 | 5/1997 | Kim et al. | 445/24 |
| 5,635,102 | 6/1997 | Mehta | 428/428 |
| 5,653,619 | 8/1997 | Cloud et al. | 445/24 |
| 5,662,772 | 9/1997 | Scheiter et al. | 216/2 |
| 5,827,780 | 10/1998 | Hsia et al. | 438/692 |
| 5,871,885 | 2/1999 | Roh | 430/313 |

OTHER PUBLICATIONS

"The Right Tool for Polyimide Processes", Copyright 1995 Ultratech Stepper.

Ma, Y. et al., J. Vac. Sci, Technol, B 13(4), Jul./Aug. 1996, "Vapor Phase SiO2 etching and metallic contamination removal in an integrated cluster system", pp. 1460–1465.

Munoz, J., et al., *J. Vac. Sci. Technol*, B 13(6), Nov./Dec. 1995, "Dry development of photosensitive polyimides for high resolution and aspect ration applications," pp. 2179–2183.

*Primary Examiner*—Kathleen Duda
*Attorney, Agent, or Firm*—Hale and Dorr LLP

[57] ABSTRACT

A layer of polyimide or polysilicon is used as a mask in vapor hydrogen fluoride etching. Both non-photosensitive and photosensitive type polyimide may be used. A non-photosensitive polyimide mask requires the use of photoresist for patterning with a lithographic mask. Alternatively, photosensitive type polyimide may be patterned directly with the use of a lithographic mask. The resulting polyimide mask enables the etching of very small features with great uniformity. Such etching may be used to expose micropoint emitters of field emission devices.

15 Claims, 12 Drawing Sheets

700

POLYIMIDE AS A MASK IN VAPOR HYDROGEN FLUORIDE ETCHING

CROSS-REFERENCE TO RELATED APPLICATIONS

This application is a divisional of Ser. No. 08/773,272, filed Dec. 23, 1996, pending, which is expressly hereby incorporated by reference.

GOVERNMENT RIGHTS

This invention was made with Government support under Contract No. DABT63-93-C-0025 awarded by the Advanced Research Projects Agency (ARPA). The Government has certain rights in this invention.

BACKGROUND OF THE INVENTION

The present invention concerns an etching method and apparatus that allows etching of very small features with great uniformity and, in particular, using polyimide as a mask in vapor hydrogen fluoride ("HF") etching.

As microstructures decrease in size, it becomes more difficult to selectively etch individual features of many devices. Conventional wet etching processes, although capable of selective etching, often cannot handle very small or finely detailed etching tasks because the wet etching process is limited by surface tension of the etching solution and air bubbles contained within the etching solution. In contrast, conventional plasma etching techniques enable more detailed etching but cannot be selectively controlled with a comparable degree of precision. In short, current etching techniques fail to provide a suitable method for selectively etching very small features and, in particular, for selectively etching very small features in a uniform manner.

Accordingly, an improved method and apparatus for accurately and uniformly etching very small features is desired.

SUMMARY OF THE INVENTION

The present invention utilizes a polyimide mask in conjunction with vapor HF etching to achieve etching of very small features with great uniformity.

In one aspect of the invention, a method for selectively removing portions of an etchable material is provided including the steps of depositing a layer of polyimide on the etchable material, patterning the layer of polyimide to expose portions of the etchable material, etching the etchable material using vapor HF in accordance with a pattern defined by the layer of polyimide, and removing the layer of polyimide. Both non-photosensitive and photosensitive polyimide may be used.

In another aspect of the invention, a mask for vapor hydrogen fluoride etching is provided which includes a layer of patterned polyimide.

A further understanding of the nature and advantages of the invention may be realized by reference to the remaining portions of the specification and drawings.

DESCRIPTION OF SPECIFIC EMBODIMENTS

Figure 1:
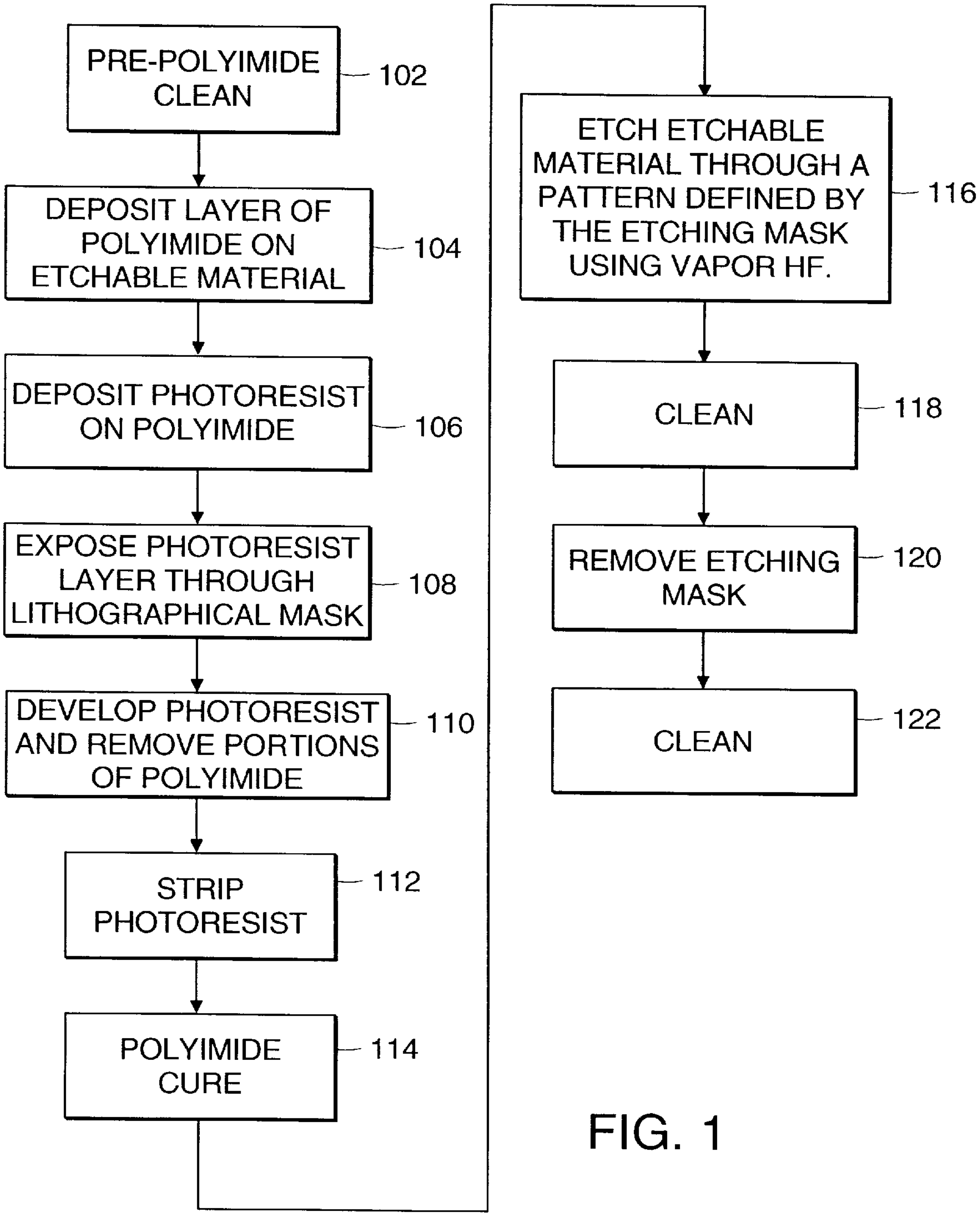
FIG. 1 is a flow chart of a first method for etching a semiconductor-chip layer in accordance with the principles of the invention.
Figure 2A:
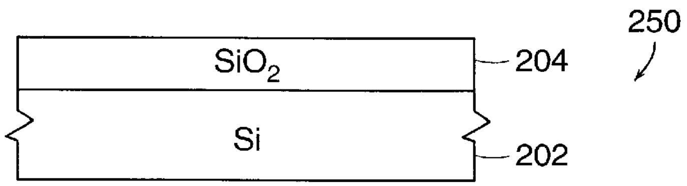
FIGS. 2A–2G illustrate application of the method shown in FIG. 1.

FIG. 1 is a flow chart illustrating steps of an etching process carried out pursuant to the principles of the invention. Individually, each step is carried out through the use of conventional process techniques and materials well known to those having ordinary skill in the art. The process may be performed on any material capable of being etched (i.e., "etchable material") such as silicon dioxide. FIG. 2A, for example, shows etchable material in the form of a silicon dioxide layer 204 which is formed over a silicon substrate 202. These layers combine to form assembly 250. Substrate 202 may be a single crystal silicon layer. Alternatively, substrate 202 may be constructed from one or more semiconductor layers or structures that include active or operable portions of semiconductor devices. In the following description, assemblies 250–262 (FIGS. 2A–2G) will be used to illustrate the process of FIG. 1.

Referring to block 102 of FIG. 1, initially, structure 250 is cleaned in preparation for the forming of a polyimide layer. Such cleaning enhances the adhesiveness of polyimide to the underlying layer. This step may be carried out through the use of a variety of conventional materials including: ST-22 (positive photoresist stripper) available from Advanced Chemical Systems International, Inc., having a principal place of business at 1200 West Jackson Road, Carrollton, Tex. ("ACSI"); Photoresist Stripper Rinse ("PSR") also available from ACSI; and deionized water. Structure 250 is initially immersed in ST-22 for approximately 15 minutes at about 85° C. The structure is next immersed in PSR for approximately 10 minutes at about 25° C. (i.e., room temperature). Finally, structure 250 is immersed in deionized water for approximately 5–10 minutes, again at room temperature.

Referring to blocks 104 and 106 in FIG. 1, layers of polyimide and photoresist are next deposited on the etchable material (i.e., silicon dioxide layer 204). These steps are illustrated by structure 252 of FIG. 2B, which shows photoresist layer 208 disposed on top of polyimide layer 206 which is, in turn, disposed on top of silicon dioxide layer 204. Layer 206 may be deposited using standard photoresist spin coating techniques. As is well known, layer thickness is dependent upon spin speed. For example, spin speeds of about 5000 rpm and 2300 rpm produce polyimide layers of about 5.4 micrometers and 11.7 micrometers thick, respectively. (The allowable duration of vapor HF etching is dependent at least in part upon the thickness of polyimide layer 206.) After depositing the polyimide layer, the resulting structure is baked for approximately 120 seconds at about 130° C. to remove solvents from the top of the structure. Any commercially available polyimide may be used, such as du Pont PI-1111 available from E. I. du Pont de Nemours and Company, headquartered at 1007 Market Street, Wilmington, Del. 19898.

Figure 2B:
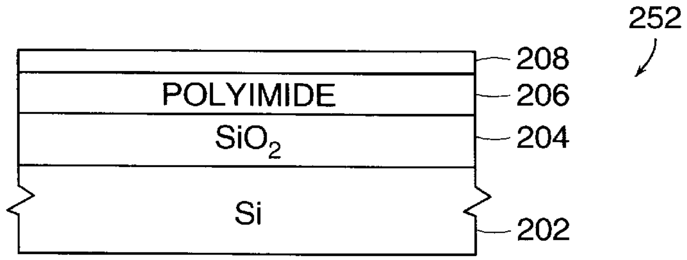

Referring again to FIG. 1, a positive photoresist layer is next deposited over the polyimide layer pursuant to block 106. Referring to FIG. 2B, photoresist layer 208 is also deposited using standard photoresist spin coating techniques. Preferably, layer 208 is deposited at a spin speed of approximately 3000 rpm to achieve a thickness of approximately 1.45 micrometers. After depositing this material, structure 252 is baked for approximately 60 seconds at about 90° C. Any commercially available photoresist may be used, such as OiR 897-10i (positive photoresist) available from OCG Microelectronics Materials, Inc., located at Three Garret Mountain Plaza, West Paterson, N.J. 07424.

Figure 2C:
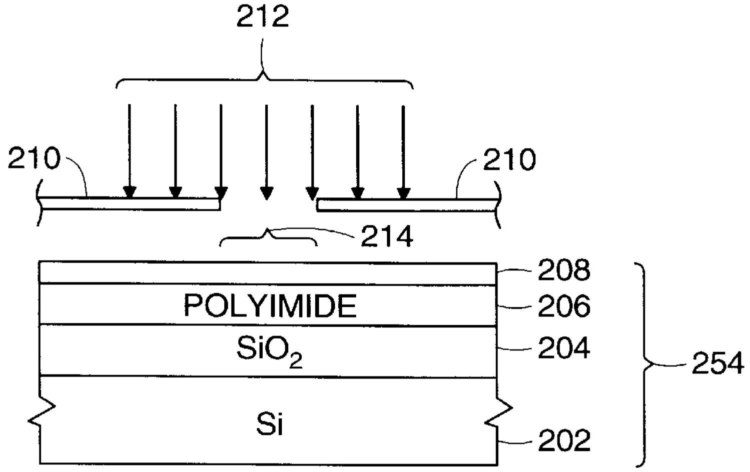
Figure 2D:
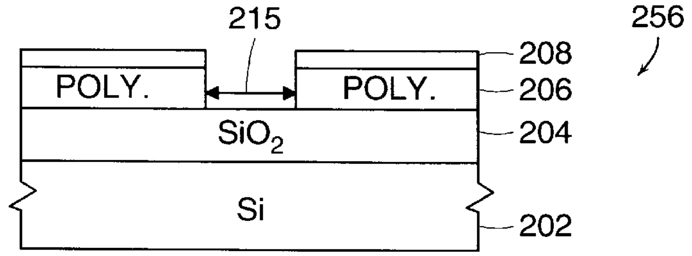

After deposition, photoresist layer 208 is exposed through a standard lithographical mask, pursuant to block 108 in FIG. 1. Such exposure alters the molecular structure of layer 208 in selected areas pursuant to a pattern defined by the lithographical mask. This step is illustrated in FIG. 2C, which shows a portion of a lithographical mask 210 disposed above photoresist layer 208.

As is well known in the art, mask 210 selectively controls exposure of the underlying photosensitive surface to ionizing radiation 212 (e.g., ultraviolet light or low energy x-rays). A portion of radiation 212 is stopped by mask 210 while the remainder is allowed to pass through the mask and alter the underlying material pursuant to the pattern of the mask. In this case, radiation 212 is allowed to expose positive photoresist layer 208 at area 214. The preferred radiation exposure dose is approximately 250 mj of ultraviolet light.

After exposure, photoresist layer 208 is developed and underlying portions of polyimide layer 206 are removed by a multi-step operation pursuant to block 110 of FIG. 1. Initially, structure 254 (FIG. 2C) is baked at approximately 120° C. for about 60 seconds. Next, this structure is exposed to a solvent such as HPRD 435 (available from the Olin Corporation, which is located at 501 Merritt 7, Norwalk, Conn. 06856) using a commercially available developer, such as the Developer Trek (available from Silicon Valley Group, Inc., which is located at 101 Metro Drive, San Jose, Calif. 95110). Specifically, structure 254 is spun by the developer in conventional fashion while the surface is alternatingly sprayed with HPRD 435 and deionized water in accordance with the sequence set out in Table 1.

TABLE 1

Developing step spraying sequence and parameters

| Sub-Step | Material | Duration (seconds) |
|---|---|---|
| 1 | HPRD 435 | 25 |
| 2 | deionized water | 35 |
| 3 | HPRD 435 | 15 |
| 4 | deionized water | 20 |

As set out in Table 1, the developing step spraying sequence begins with HPRD 435 in sub-step 1 and finishes with deionized water in sub-step 4. This sequence takes place at a temperature of approximately 25° C. Upon completion of this sequence, structure 254 is baked at approximately 135° C. for about 60 seconds to remove residual moisture.

The net result of developing step 110 is to remove exposed portions of photoresist layer 208 and any underlying polyimide layer 206 uncovered from the removal of such exposed portions of photoresist layer 208. This process produces structure 256 of FIG. 2D. As shown in this figure, a portion of layers 208 and 206 have been removed leaving a gap 215. Accordingly, photoresist layer 208 is patterned in accordance with mask 210, and polyimide layer 206 is patterned in accordance with photoresist layer 208.

Referring again to FIG. 1, the next step in this process is to strip the photoresist layer from the underlying polyimide layer pursuant to block 112. In this case, photoresist layer 208 is stripped through the use of any conventional plasma process well known to those having ordinary skill in the art. Plasma is necessary because polyimide layer 206 is not yet cured and therefore use of a solvent to strip the photoresist would also dissolve some of the polyimide, which is undesirable. Stripping of the photoresist layer 208 results in structure 258 of FIG. 2E.

Polyimide layer 206 is cured before it is used as an etching mask. Accordingly, referring to FIG. 1, the next step in this process is to cure polyimide layer 206 pursuant to block 114. The curing step preferably uses a 3-cycle heating process. Initially, structure 258 (FIG. 2E) is heated to approximately 135° C. for about 3 hours. The temperature is then increased to approximately 300° C. and sustained for about another 2 hours. Finally, the temperature is returned to 135° C. and sustained for about another 3 hours. This 3-cycle approach is preferred because it provides a gradual increase and decrease in temperature of the polyimide layer. If this layer is heated too quickly, cracks may develop in the layer because exterior portions will expand faster than interior portions. The thickness of layer 206 will undergo a slight reduction due to this curing step. Upon completion of these curing cycles, polyimide layer 206 now forms an etching mask 220 over silicon dioxide layer 204. Mask 220, having a pattern derived from lithographical mask 210 (through photoresist layer 208), will facilitate vapor HF etching as described below. For clarity, structure 258 is referred to herein as "cured structure 258" upon completion of the curing step of block 114.

Pursuant to block 116 in FIG. 1, etchable material (i.e., silicon dioxide layer 204 of FIG. 2E) is etched through the process of vapor HF etching. HF is a well-known etchant that easily dissolves silicon dioxide. Use of hydrofluoric acid (i.e., hydrogen fluoride in aqueous solution) in an aqueous etching solution and vapor etching is discussed in U.S. Pat. Nos. 4,040,897 and 4,904,338, respectively, both of which are hereby incorporated by reference in their entirety for all purposes. In the preferred method, vapor HF etching is carried out through the use of an Excaliber ISR Vapor Phase Cleaning System available from FSI International, located at 322 Lake Hazeltine Drive, Chaska, Minn. 55318 ("Excaliber System").

The operations and parameters preferably used to etch silicon dioxide using vapor HF pursuant to block 116 in FIG. 1 are set out below in Table 2 (all numerical values in this table are approximate). The five operations identified in Table 2, each of which is performed at room temperature (i.e., about 25° C.), are collectively referred to as the "vapor HF etching cycle." Referring to Table 2, "Excaliber Control"

represents the percentage of total flow available of a particular gas in the Excaliber System. The corresponding flow rate in terms of SLM (Standard Liters Per Minute) and SCCM (Standard Cubic Centimeters Per Minute) is provided in the table. In each operation of the cycle, the "material" (i.e., gas) identified in Table 2 is passed across the surface of the subject structure (e.g., cured structure 258 of FIG. 2E) pursuant to the flow rate in the table. The ratio of $N_2$ gas to vapor $H_2O$ in the "pretreat" etching operation is about 5 to 1. The ratio of $N_2$ gas to vapor $H_2O$ to HF vapor in the "etch" step is approximately 150 to 30 to 7. Given the combination of elements and flow rates as provided in Table 2, the resulting etch rate of this operation is approximately 1000angstroms for every 10 seconds.

TABLE 2

Vapor HF Etching Cycle

| Operation | Material | Excaliber Control | Flow Rate (SLM/SCCM) | Duration |
|---|---|---|---|---|
| Initial Purge | $N_2$ | 60% | 18/18000 | 5 seconds |
| Pretreat | $N_2$ | 25% | 7.5/7500 | 5 seconds |
| | Vapor $H_2O$ | 75% | 1.5/1500 | |
| Etch | $N_2$ | 25% | 7.5/7500 | Up to |
| | Vapor $H_2O$ | 75% | 1.5/1500 | 20 seconds |
| | Vapor HF | 35% | 0.35/1400 | |
| Dilute HF | Vapor $H_2O$ | 70% | 1.4/1400 | 60 seconds |
| High Purge | $N_2$ | 75% | 21/21000 | 30 seconds |

Figure 2E:
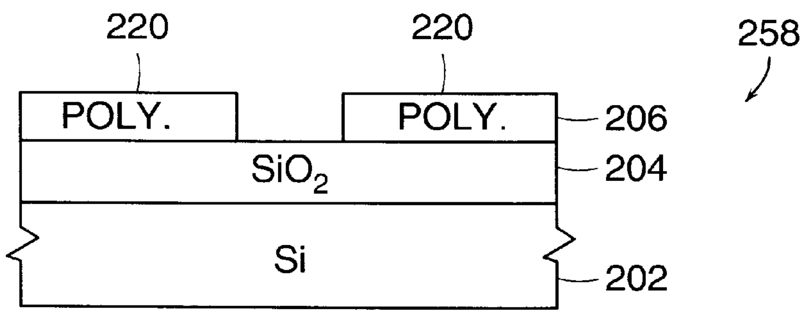

As shown in Table 2, the first operation of the etching cycle is an "initial purge" which removes oxygen ($O_2$) from the surface of cured structure 258 (FIG. 2E). This is carried out by exposing the surface of cured structure 258 in $N_2$ gas in accordance with the parameter set out in Table 2. Next, the surface of structure 258 undergoes a "pretreat" operation with $N_2$ gas and vapor $H_2O$ in accordance with the parameters of Table 2. Pretreatment is followed by actual etching which, as noted above, uses the elements of $N_2$ gas, vapor $H_2O$ and vapor HF. The speed of this "etch" operation is enhanced by adding $H_2O$ to the vapor HF. As noted above, the etch rate for the operation shown in Table 2 is approximately 1000 angstroms per 10 seconds. Accordingly, a 20 second etch operation (the maximum duration indicated in Table 2) results in an etch of approximately 2000 angstroms. (In contrast, eliminating vapor $H_2O$ from this process reduces the etching rate to about 60 angstroms per 10 seconds.) Next, residual HF is removed through the "dilute HF" operation described in Table 2. Finally a "high purge" operation is performed in accordance with the parameters set out in Table 2 to dry the surface of structure 258. These five operations may be repeated until a desired etch depth is achieved.

In accordance with the cycle of Table 2, etching may be carried out continuously for up to about 20 seconds. Continuous etching for a period longer than this time may cause polyimide mask 220 to crack. Should additional etching be desired, the five-step vapor HF etching cycle may be repeated as many times as necessary to achieve the desired depth, with the etch step in each cycle lasting no more than about 20 seconds in duration. The vapor HF etching cycle carried out pursuant to block 116 in FIG. 1 produces, for example, structure 260 of FIG. 2F.

The allowable duration of vapor HF etching is dependent at least in part upon the thickness of polyimide layer 206 (other factors affecting allowable etching duration include process parameters such as set out in Table 2). The greater the duration of etching, the deeper the etch. For example, given the etching parameters of Table 2, a polyimide layer thickness of about 5.4 or 11.7 micrometers (measured before the curing step of block 114 in FIG. 1 which slightly reduces this thickness) enables an etch depth of about 4000 or 8000 angstroms, respectively. More specifically, an initial polyimide-layer thickness of about 5.4 or 11.7 micrometers is sufficient to produce a mask 220 that can sustain vapor HF etching (as described in Table 2) for at least about 40 or 80 seconds, respectively. (Such 40 or 80-second etching intervals are achieved through repetitive etch operations of about 20 seconds in duration each pursuant to the foregoing discussion.) Based upon the etch rate of the operation in Table 2, 40 or 80 seconds of etching results in an etch depth of about 4000 or 8000 angstroms, respectively, into oxide layer 204 (i.e., dimension "y" in FIG. 2F).

Referring again to FIG. 2F, structure 260 is next subjected to a cleaning step pursuant to block 118. This step entails the immersion of structure 260 in deionized water for about 10 minutes at room temperature. Next, polyimide mask 220 is removed pursuant to block 120 (FIG. 1) using any method known in the art. For example, this mask may be removed by immersing structure 260 in QZ 3321 polyimide stripper for approximately 25 minutes at about 100° C. This stripper is available from CIBA-Geigy Corporation, P. O. Box 2005, 540 White Plains Road, Tarrytown, N.Y. 10591. Removal of polyimide mask 220 results in structure 262 of FIG. 2G, which includes an etched silicon dioxide layer 204 disposed over silicon substrate 202. Referring to FIG. 1, this resulting structure is subjected to a cleaning operation pursuant to block 122. In accordance with this operation, structure 262 is immersed in deionized water for approximately 15 minutes at room temperature.

Figure 3:
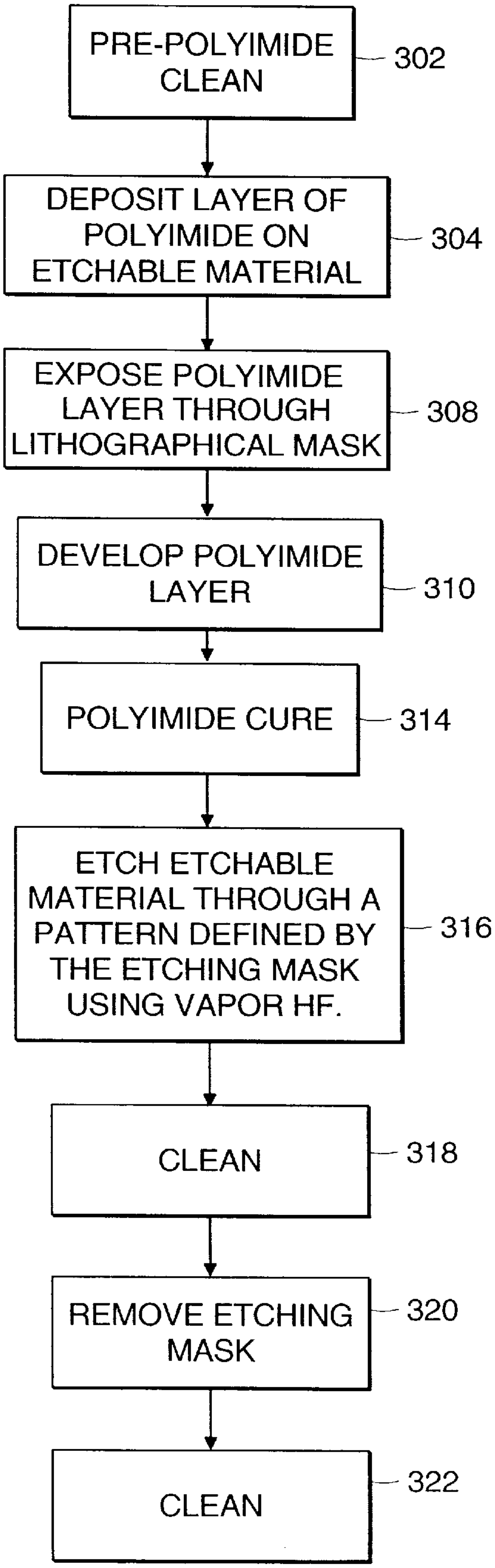
FIG. 3 is a flow chart of a second method for etching a semiconductor-chip layer in accordance with the principles of the invention.
Figure 4A:
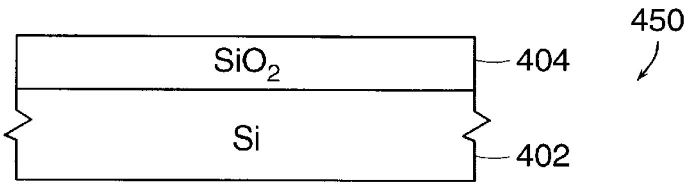
FIGS. 4A–4F illustrate application of the method shown in FIG. 3.

FIG. 3 is a flow chart containing steps of an alternative etching process carried out pursuant to the principles of the invention. The etching process of FIG. 3 is prospective; i.e., it has not yet been practiced. Individually, each step may be performed through the use of conventional process techniques and materials well known to those having ordinary skill in the art. The most significant difference between the processes of FIGS. 1 and 3 is polyimide type; the process of FIG. 1 uses non-photosensitive polyimide while the process of FIG. 3 uses photosensitive polyimide. Accordingly, the process of FIG. 3 eliminates use of a photoresist layer over the polyimide (e.g., blocks 106–110 of FIG. 1). Like the process of FIG. 1, the process of FIG. 3 may be performed on any etchable material, as described above. FIG. 4A, for example, shows etchable material in the form of a silicon dioxide layer 404 which is disposed on the surface of a silicon substrate 402. These layers combine to form assembly 450. In the following description, assemblies 450–460 (FIGS. 4A–4F) will be used to illustrate the process steps set out in FIG. 3.

Figure 4B:
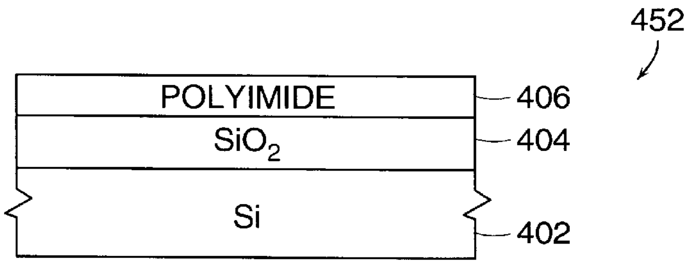

Referring to block 302 of FIG. 3, a pre-polyimide cleaning operation is carried out as described above in connection with block 102 of FIG. 1. Next, pursuant to block 304 in FIG. 3, a layer of photosensitive polyimide is deposited on etchable material. This step is illustrated in FIG. 4B, which shows polyimide layer 406 disposed on top of silicon dioxide layer 404. Layer 406 may be deposited pursuant to the method and parameters described above with respect to block 104 of FIG. 1. Preferably, polyimide layer 406 is deposited to a thickness of approximately 5.4 or 11.7 micrometers to achieve an etch depth of about 4000 or 8000 angstroms, respectively, as discussed below. Any commercially available photosensitive polyimide may be used, such as CRC-6090 (high resolution, positive type) available from Sumitomo Bakelite Co., Ltd., a Japanese corporation.

Figure 4C:
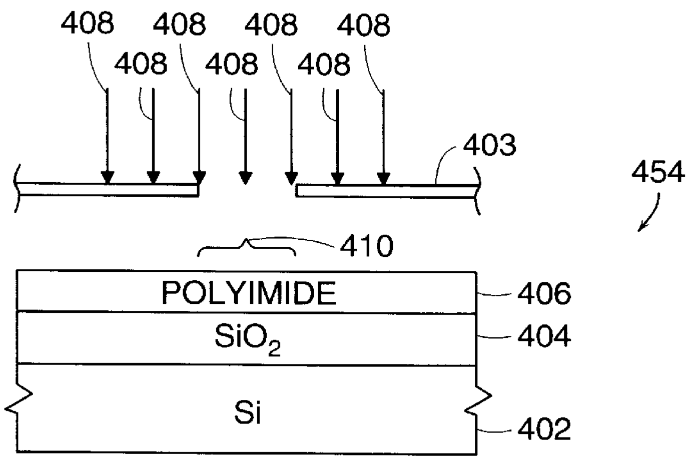

After deposition, polyimide layer 406 is exposed through a standard lithographical mask, pursuant to block 308 in FIG. 3. Such exposure alters the molecular structure of layer 406 in selected areas pursuant to a pattern defined by the lithographical mask. This step is illustrated in FIG. 4C, which shows a portion of a lithographical mask 403 disposed above polyimide layer 406. As described above, mask 403 selectively controls exposure of an underlying photosensitive surface to ionizing radiation 408 (e.g., ultraviolet light or low-energy x-rays). A portion of radiation 408 is stopped by mask 403 while the remainder is allowed to pass through the mask and alter the underlying material pursuant to the pattern of the mask. In this case, radiation 408 is allowed to expose polyimide layer 406 at area 410. The radiation exposure dose may be determined empirically or set as recommended by the polyimide manufacturer.

Figure 4D:
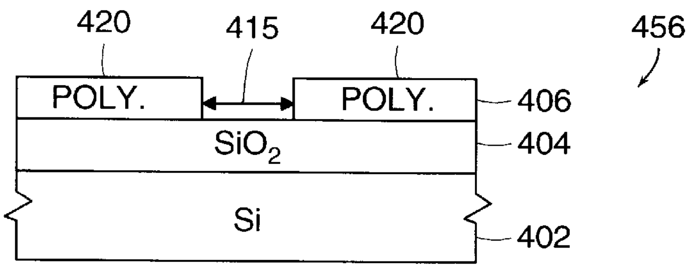

After exposure, polyimide layer 406 is developed by any technique known to those having ordinary skill in the art pursuant to block 310 of FIG. 3. In general, exposed layer 406 may be immersed in a suitable solvent that dissolves only exposed portions of the polyimide layer. This process produces structure 456 of FIG. 4D. As FIG. 4D shows, a portion of layer 406 has been removed leaving a gap 415. Accordingly, polyimide layer 406 is patterned in accordance with mask 403. Polyimide layer 406 is next cured, pursuant to block 314 of FIG. 3 using any technique known in the art. As in the process of FIG. 1, layer 406 will undergo a slight reduction in thickness due to this curing step. Thereafter, layer 406 forms an etching mask 420 over silicon dioxide layer 404. Mask 420, having a pattern derived from lithographical mask 403, will facilitate vapor HF etching, as described below.

Pursuant to block 316 in FIG. 3, structure 456 is etched through the process of vapor HF etching. This process is carried out as described above in connection with block 116 of FIG. 1 and Table 2. The vapor HF etching process carried out pursuant to block 316 of FIG. 3 produces, for example, structure 458 of FIG. 4E.

Like polyimide layer 206 of FIGS. 2B–2E, the thickness of polyimide layer 406 of FIGS. 4B–4D controls, at least in part, the allowable duration of vapor HF etching. For example, it is believed a thickness of polyimide layer 406 of about 5.4 or 11.7 micrometers (measured before the curing step of block 314 in FIG. 3) will produce a mask 420 (pursuant to blocks 308–314 of FIG. 1) that can sustain vapor HF etching (as described in Table 2) for at least about 40 or 80 seconds, respectively. Such duration (applied in intervals of up to 20 seconds each, as described above) will enable an etch depth of about 4000 or 8000 angstroms, respectively, into oxide layer 404 (i.e., dimension "y" in FIG. 4E). This is based on the same analysis as described above with respect to polyimide layer 206.

Returning again to FIG. 3, structure 458 is next subject to cleaning pursuant to block 318. This step is carried out in accordance with block 118 of FIG. 1. Next, polyimide mask 420 created out of layer 406 is removed pursuant to block 320. This step is performed in accordance with block 120 of FIG. 1. Removal of polyimide mask 420 results in structure 460 of FIG. 4F, which includes an etched silicon dioxide layer 404 disposed over silicon substrate 402. Referring to FIG. 3, this resulting structure is subject to a cleaning pursuant to block 322 of FIG. 3. Again, this process is carried out in accordance with block 122 of FIG. 1.

Figure 5:
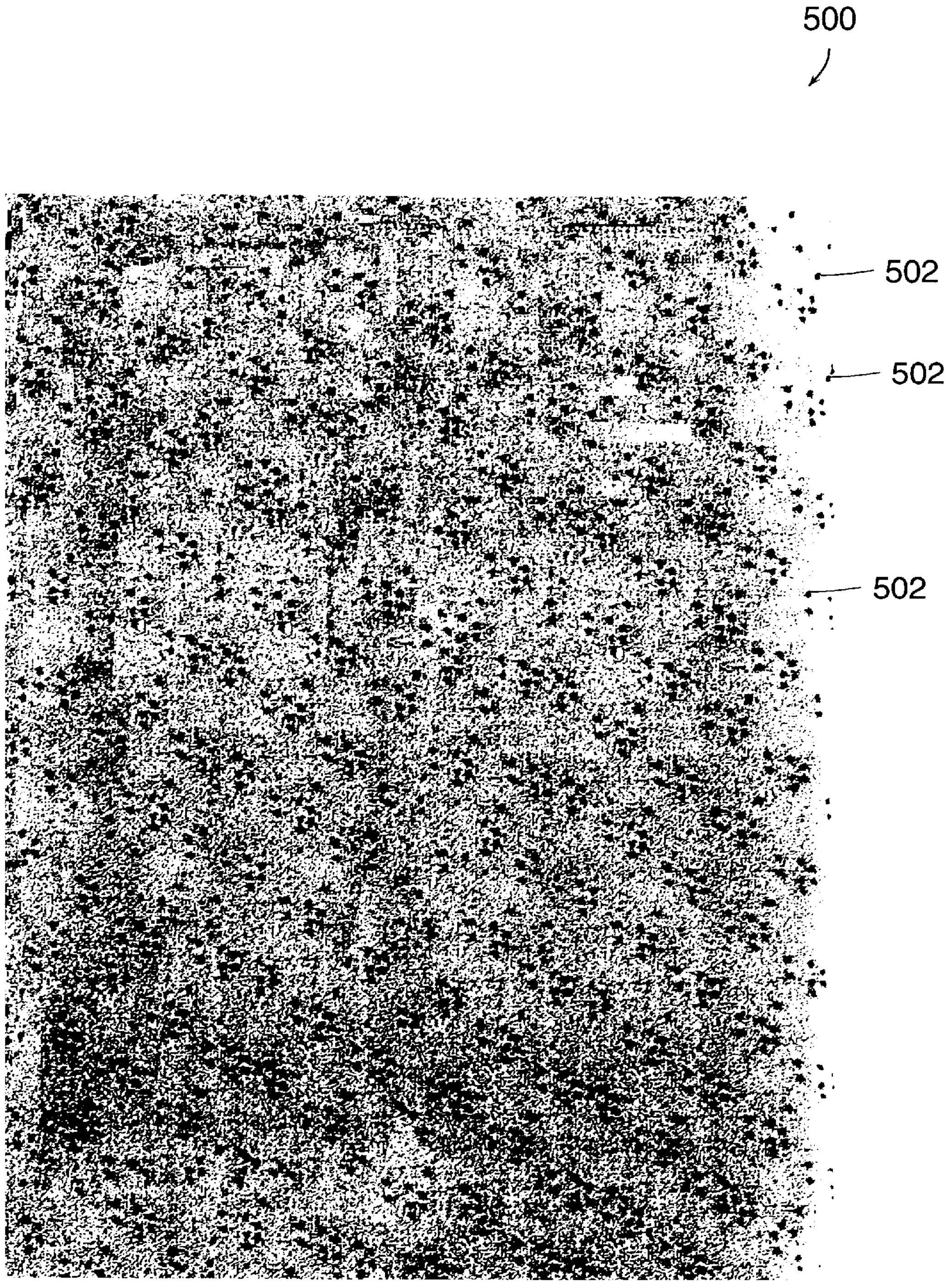
FIG. 5 is a patterned photoresist prior to etching with vapor hydrogen fluoride.
Figure 6:
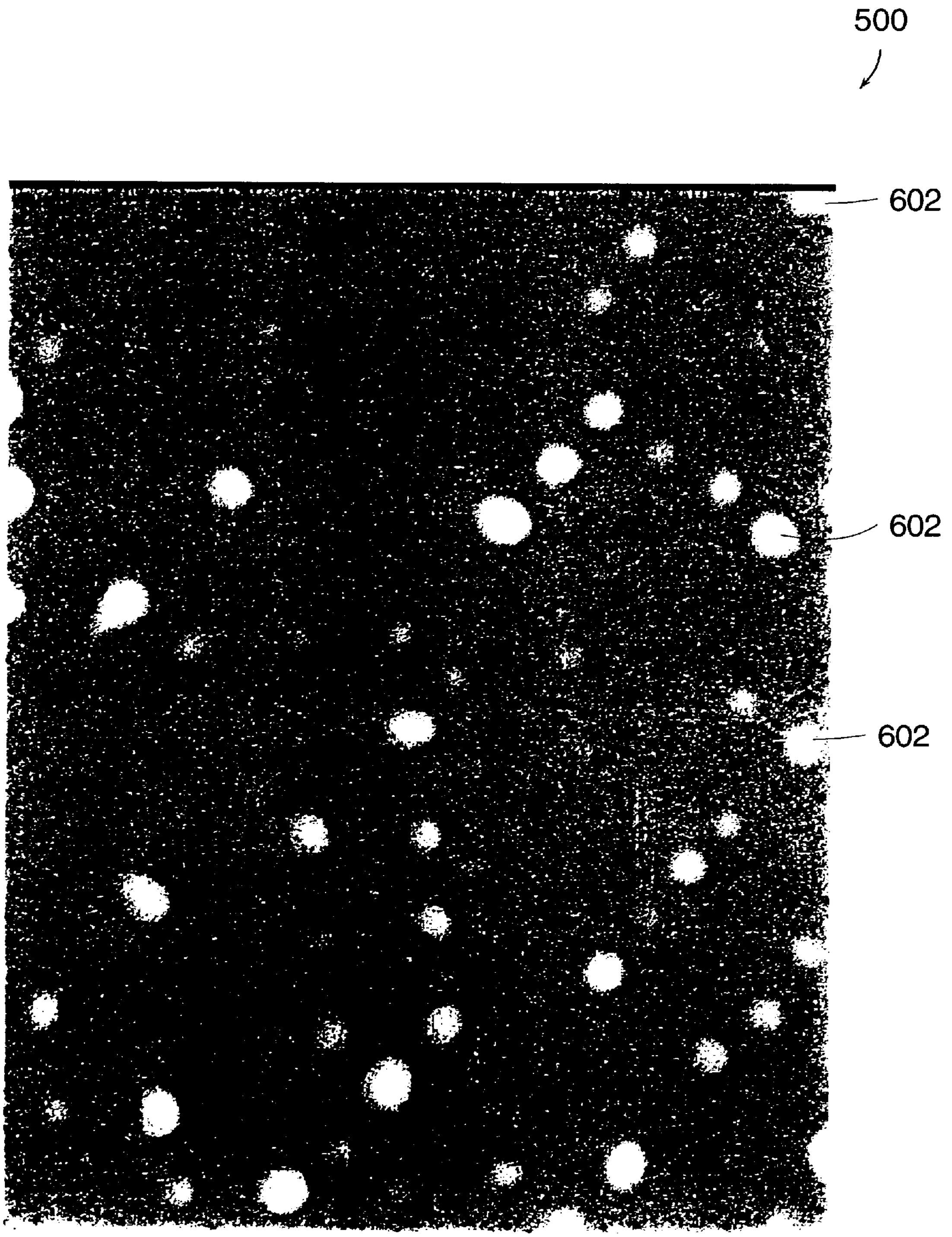
FIG. 6 is the patterned photoresist of FIG. 5 after etching with vapor hydrogen fluoride.

Vapor HF etching does not have the problems of wet etching noted above and therefore provides a method for etching small features. However, attempts to use this process with conventional photoresist (e.g., material such as OiR 897-10i, available from OCG Microelectronic Materials, Inc.) have proven unsatisfactory since vapor HF will normally penetrate through a conventional photoresist layer functioning as a mask. For example, FIG. 5 illustrates a patterned, conventional photoresist 500 prior to etching with vapor HF. As shown, photoresist 500 (approximately 1.45 micrometers thick) contains no deformations except for patterned holes 502. In contrast, FIG. 6 illustrates patterned photoresist 500 after vapor HF etching. Significantly, large, irregular holes 602 are created by the etching process rendering the photoresist useless as a mask.

Figure 2F:
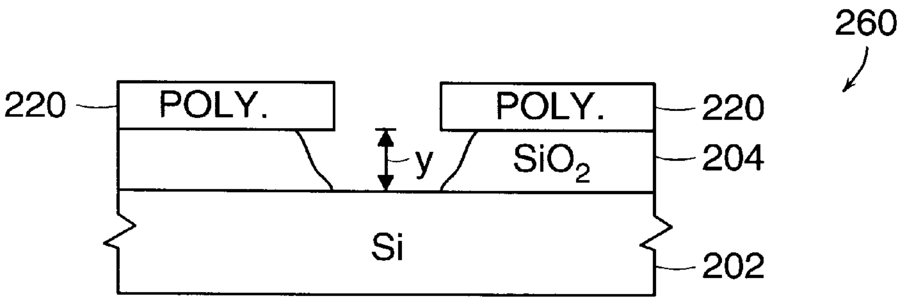
Figure 2G:
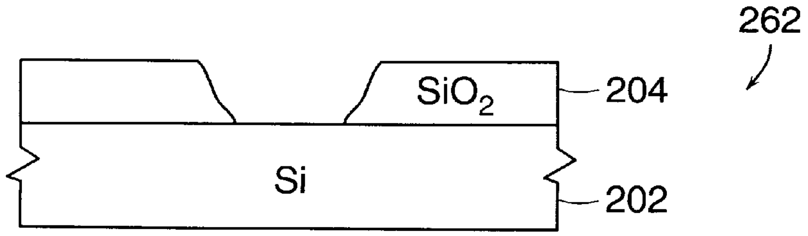
Figure 4E:
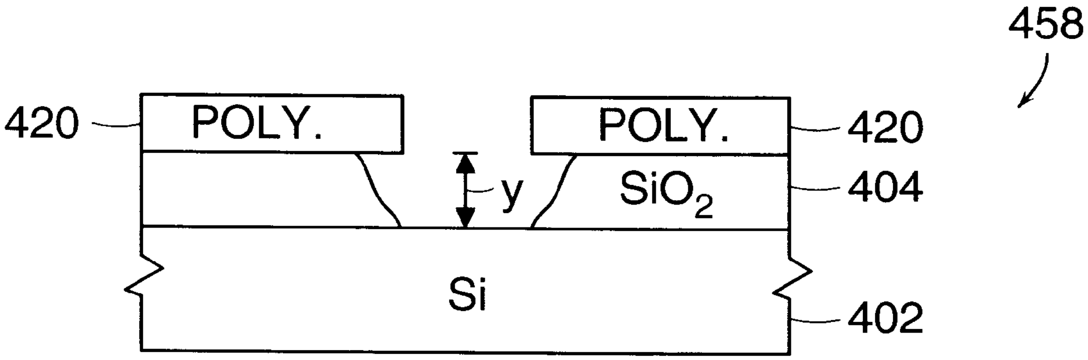
Figure 4F:
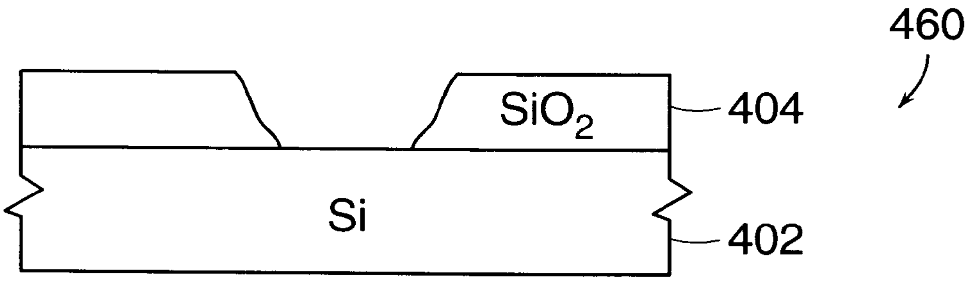
Figure 7:
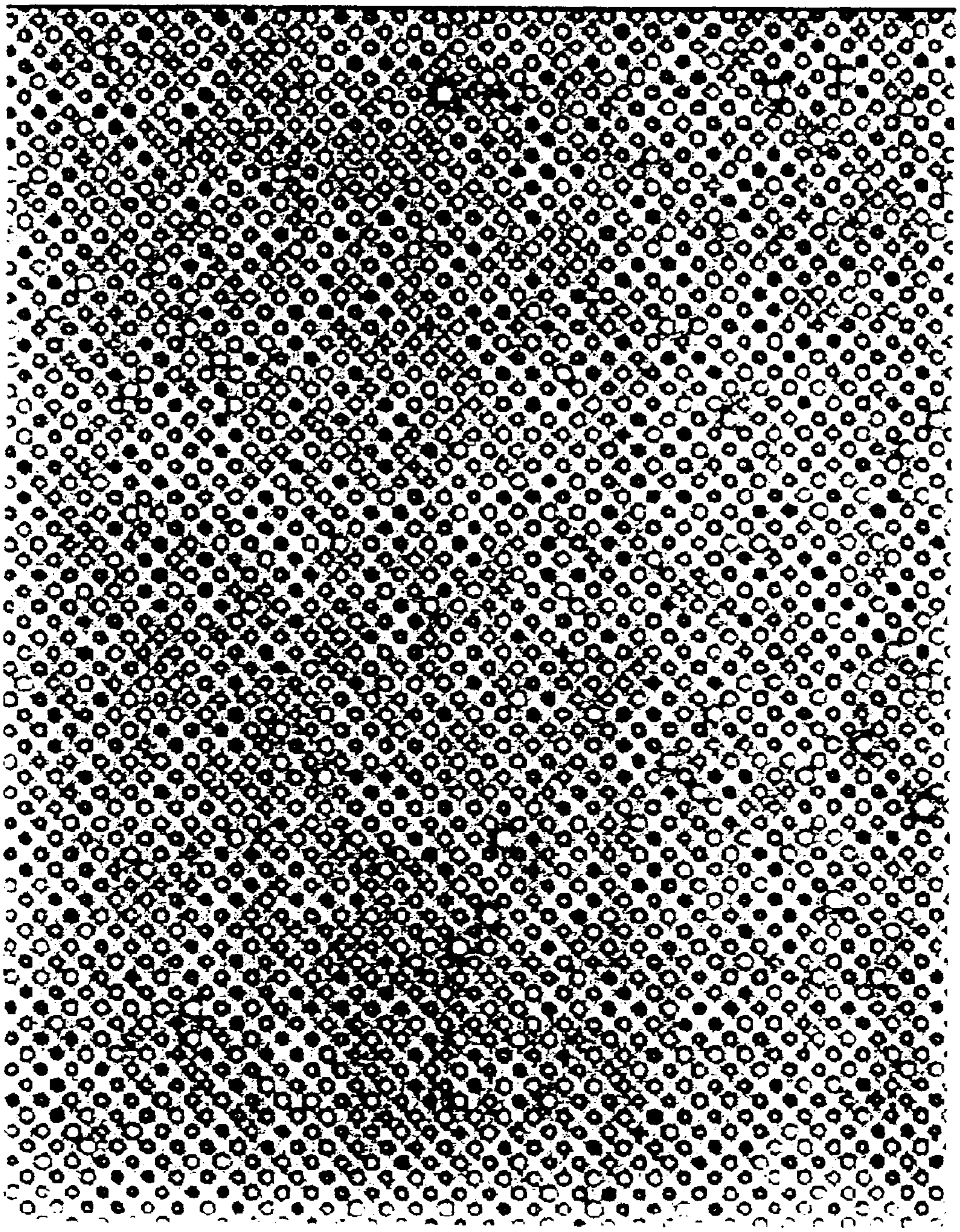
FIG. 7 is a patterned polyimide mask in accordance with the invention before etching with vapor hydrogen fluoride.
Figure 8:
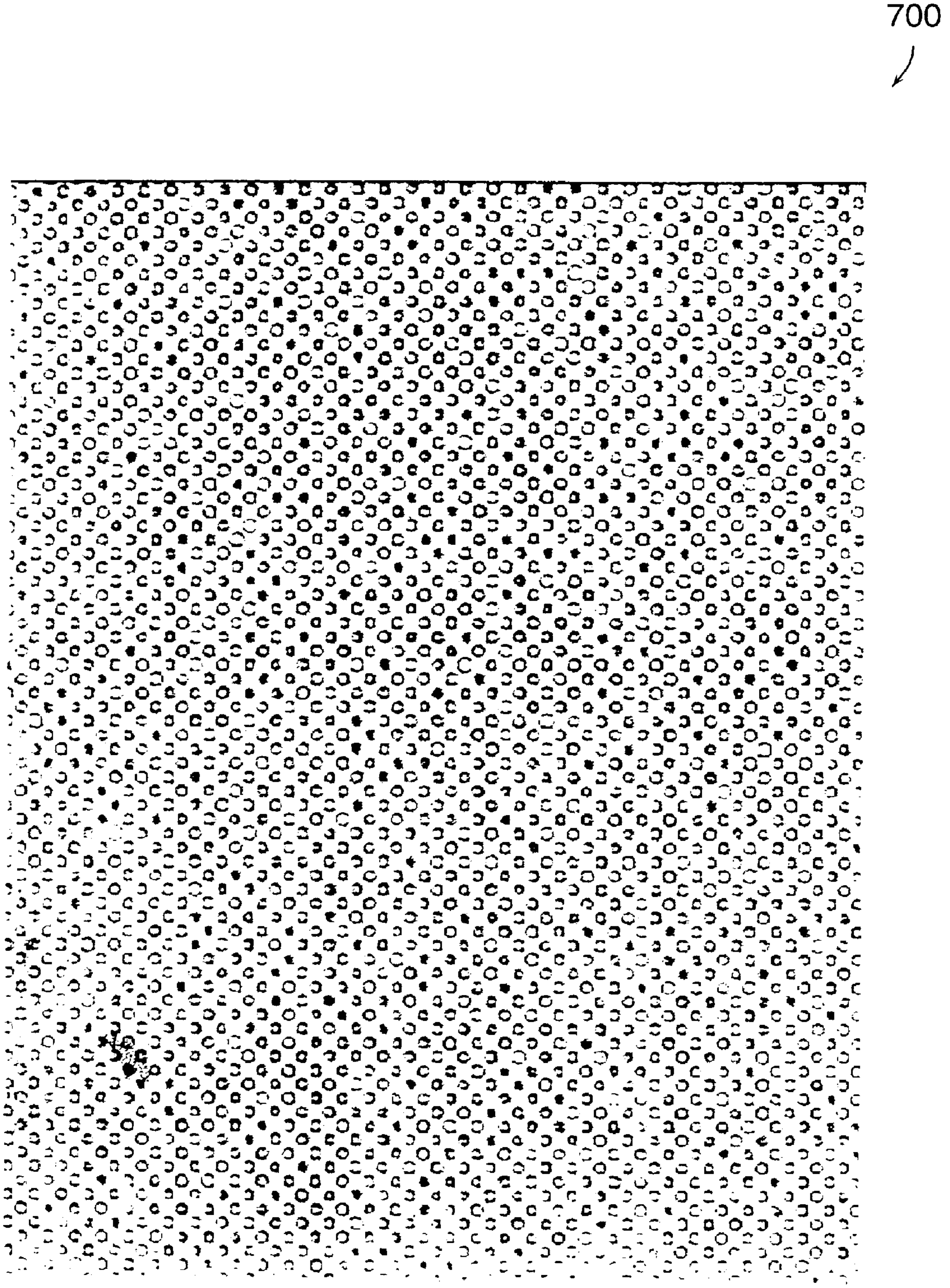
FIG. 8 is the polyimide mask of FIG. 7 after etching with vapor hydrogen fluoride.

In contrast to conventional photoresist, polyimide has demonstrated very good characteristics for blocking vapor HF during etching. For example, FIGS. 7 and 8 illustrate a non-photosensitive polyimide mask 700 (approximately 3 micrometers thick) before and after vapor HF etching, respectively. As these figures show, there is essentially no change in the structure of the mask. This is in stark contrast to photoresist 500 in FIGS. 5 and 6, which was etched for approximately the same duration and at the same etchant strength as mask 700. Thus, in accordance with the invention and as shown in FIGS. 2F and 4E, a polyimide layer can serve as an effective mask for the etching process disclosed herein.

The use of polyimide as a mask in combination with vapor HF etching enables the creation of very small features (i.e., having dimensions of less than 1.0 micrometers) with a high degree of uniformity (i.e., a standard error of 5% in oxide etch rate has recently been achieved using vapor HF etching; see, Y. Ma et al., "Vapor Phase $SiO_2$ Etching and Metallic Contamination Removal in an Integrated Cluster System," *J. Vac. Sci. Technol.,* B 13(4), pp. 1460–1465 (July/August 1995), which is hereby incorporated by reference in its entirety for all purposes).

Figure 9A:
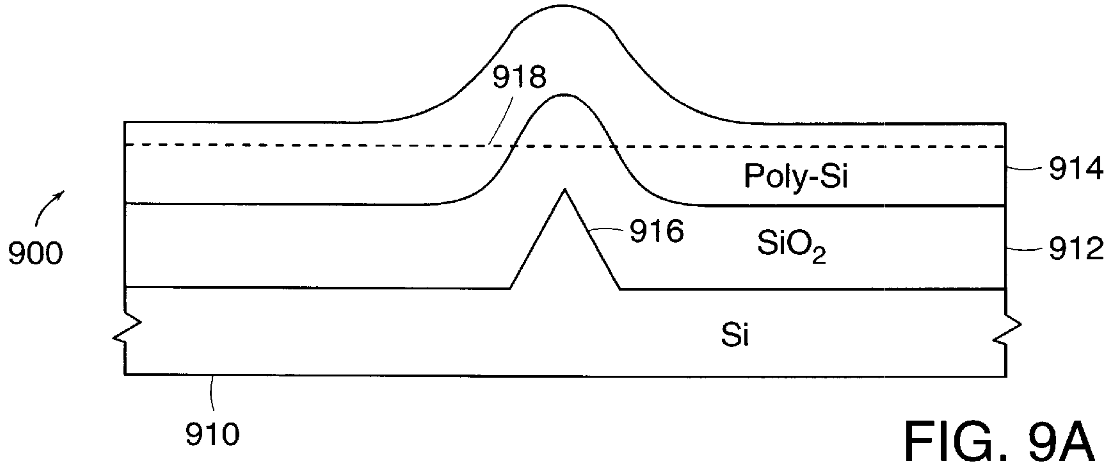
FIG. 9A shows a cross sectional view of a portion of a field emission device (FED) during an intermediate state of the fabrication of the FED.

One preferred use of the invention is for exposing micropoint emitters during the fabrication of a field emission device (FED). FIG. 9A shows a cross sectional view of an FED 900 during an intermediate fabrication step of producing the FED 900. During this state of the fabrication process, FED 900 includes a baseplate 910, which is typically fabricated from silicon; a dielectric layer 912, which is typically fabricated from $SiO_2$ and is disposed over baseplate 910; and a layer of polysilicon 914 disposed over dielectric layer 912. As shown, a conical micropoint emitter 916 extends out of baseplate 910, and dielectric layer 912 and polysilicon layer 914 cover micropoint emitter 916. As is well known, to complete fabrication of the FED 900, a significant portion of the dielectric layer 912 must be removed so as to expose the micropoint emitter 916. Those skilled in the art will appreciate that FED 900 may include many micropoint emitters such as emitter 916, as well as other structures which for convenience of exposition are not shown in FIG. 9A. FEDs such as FED 900 are discussed in greater detail in, for example, U.S. Pat. Nos. 5,302,238 and 5,229,331.

Figure 9B:
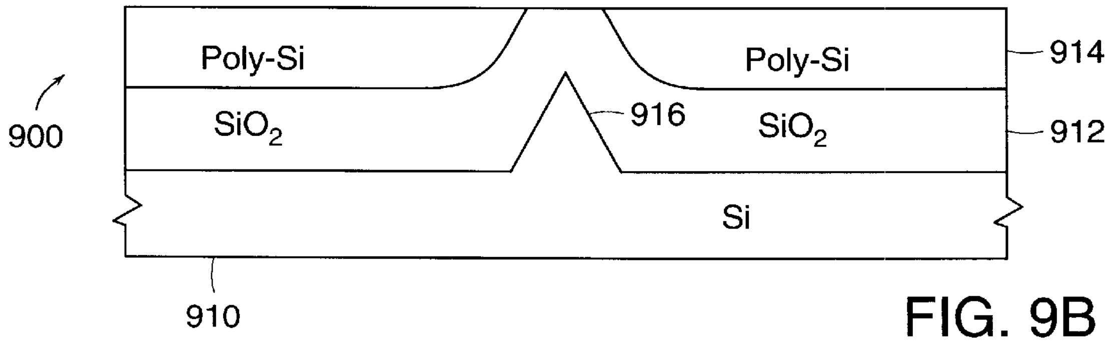
FIG. 9B shows a cross sectional view of the FED of FIG. 9A following planarization.
Figure 9C:
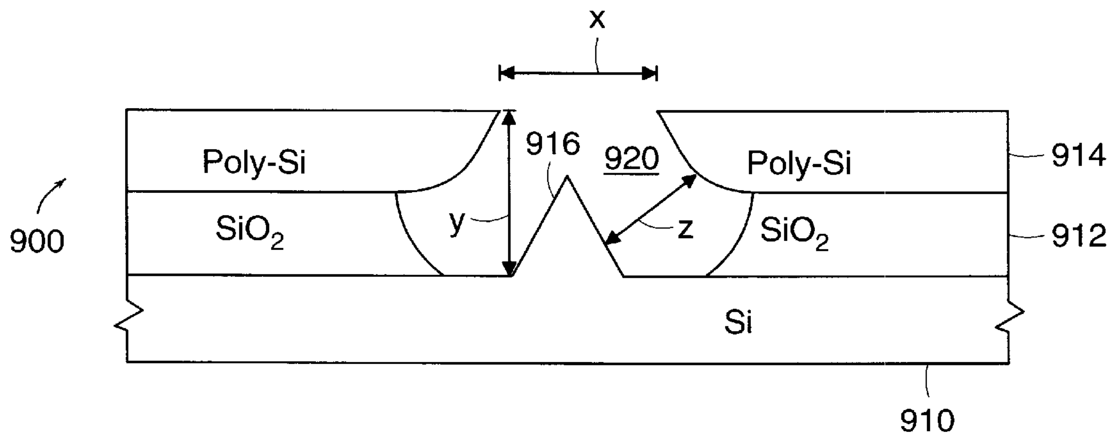
FIG. 9C shows a cross sectional view of the FED of FIG. 9B following vapor HF etching according to the invention.

The next step in the fabrication of FED 900 is to perform chemical-mechanical-planarization (using known methods) on FED 900 so as to planarize FED 900 along the dashed line 918 shown in FIG. 9A. The result of such planarization is shown in FIG. 9B. As shown, following planarization polysilicon layer 914 covers most of dielectric layer 912, however, a portion of dielectric layer 912 over micropoint 916 is exposed by the planarization. So the planarization effectively patterns the polysilicon layer 914 so as to expose selected portions of the dielectric layer 912. Following this planarization, portions of the dielectric layer 912 that cover and surround micropoint emitter 916 are preferably removed so as to expose the emitter 916. FIG. 9C shows the desired completed structure for FED 900 where an aperture 920 has been formed in dielectric layer 912 so as to expose micropoint emitter 916. However, prior art processes for forming aperture 920, and thereby exposing micropoint emitter 916, have not performed adequately.

Part of the difficulty in forming aperture 920 is that the dimensions of the aperture 920 are not suitable for use with conventional wet etching processes. For example, the dimension of the aperture 920 proximal the upper surface of polysilicon layer 914, this dimension being denoted "x" in FIG. 9C, is relatively small (e.g., 0.3–0.7 μm). Further, the distance between the bottom of the aperture 920 (at the top surface of baseplate 910) and the top of the aperture, this dimension being denoted "y" in FIG. 9C, is relatively large (e.g., 0.8–1.0 μm), and the distance between the side of emitter 916 and the side of polysilicon layer 914 measured in a direction substantially perpendicular to these sides, this distance being denoted "z" in FIG. 9C, is also relatively small (e.g., 0.3–0.4 μm). These dimensions make conventional wet etching processes unsuitable for etching dielectric layer 912. As an example, air bubbles of a size comparable to the dimension "x", which typically form during wet etching can prevent the etching material from penetrating into the dielectric layer 912. Further, plasma etching is unsuitable for forming aperture 920 because such etching is likely to also etch the surface of micropoint 916 and thereby dull or damage the relatively sharp tip of micropoint emitter 916. However, the vapor HF process described above may be applied to FED 900 to form aperture 920 by removing selected portions of the dielectric layer 912. The vapor HF process according to the invention is well suited for forming apertures of such dimensions as aperture 920.

Figure 9D:
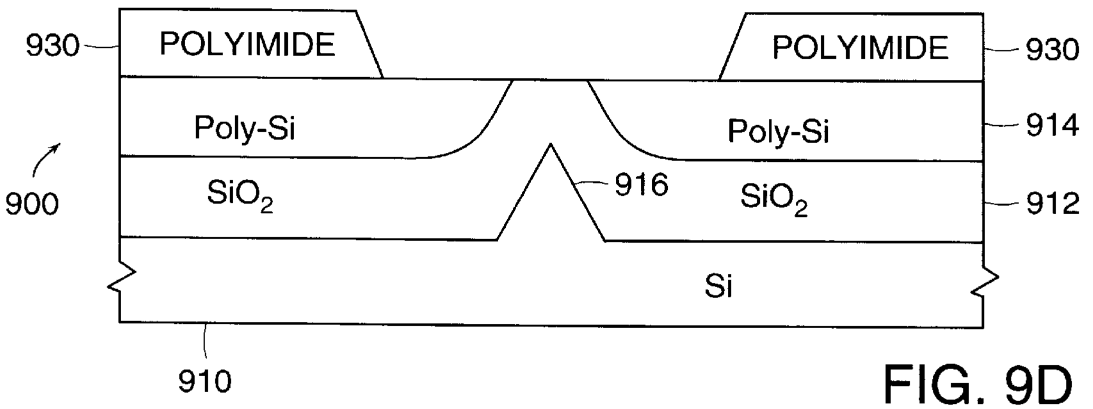
FIG. 9D shows a cross sectional view of a FED prior to vapor HF etching and including a patterned polyimide layer.

The polysilicon layer 914 behaves in a similar fashion as the polyimide layers discussed above (e.g., polyimide layer 206 of FIGS. 2B–2D), and is resistant to the vapor HF etching process. So, a patterned polyimide protecting layer need not be formed over polysilicon layer 914 prior to initiating the vapor HF etching process according to the invention. In fact, rather than using polysilicon, layer 914 is a covering layer and may be implemented using a conductive, etch resistant material such as metal, silicon based materials, or other semiconductive materials. (Covering layer 914 functions in the FED as an extraction grid for drawing electrons from the micropoint emitters). In the following description, layer 914 will be discussed as being implemented with polysilicon, however those skilled in the art will appreciate that other conductive, etch resistant materials could be used. Despite the etch resistance of polysilicon layer 914, it may be desirable to dispose such a polyimide layer over polysilicon layer 914 prior to initiating the vapor HF etching process. FIG. 9D shows such a patterned polyimide layer 930 formed over polysilicon layer 914. Polyimide layer 930 is preferably formed after planarization of FED 900 as shown in FIG. 9B. It is particularly desirable to form such a polyimide layer over portions of the FED 900 which may not be covered (and thereby protected) by polysilicon layer 914.

Figure 9E:
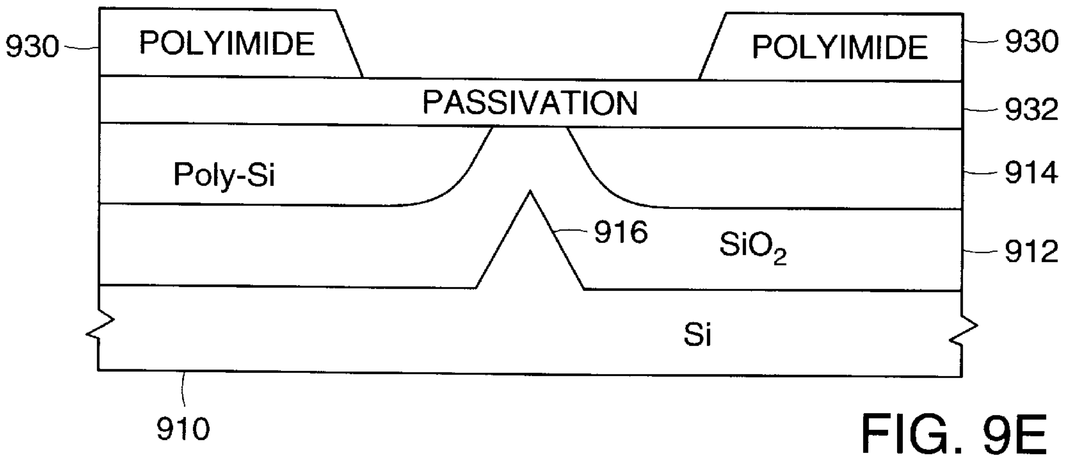
FIG. 9E shows a cross sectional view of a FED prior to vapor HF etching and including passivation and patterned polyimide layers.

In yet another variation, prior to forming a patterned polyimide layer over polysilicon layer 914, a dielectric passivation layer may be formed over polysilicon layer 914 prior to formation of patterned polyimide layer 930. Such a dielectric passivation layer 932 is shown in FIG. 9E. Passivation layer 932 is useful because it facilitates removal of polyimide layer 930. If passivation layer 932 is not used, and polyimide layer 930 is formed directly on polysilicon layer 914, the layers 930 and 914 may bond making the clean removal of polyimide layer 930 difficult. However, following formation of aperture 920 (shown in FIG. 9C) polyimide layer 930 may be easily removed from passivation layer 932 using conventional techniques, and similarly, passivation layer 932 may be easily removed from polysilicon layer 914 also using conventional techniques.

When passivation layer 932 is used, the portion of layer 932 over micropoint 916 may be etched using the vapor HF etching process that is also used to form aperture 920 (shown in FIG. 9C), or alternatively, this portion of the passivation layer 932 may be removed using dry or wet etching processes.

The invention has now been described in terms of the foregoing embodiments with variation. Modifications and substitutions will now be apparent to persons of ordinary skill in the art. For example, negative type photosensitive polyimide may be used rather than positive type. Alterations to the foregoing processes to incorporate negative type photosensitive polyimide would be apparent to one of ordinary skill in the art. Accordingly, it is not intended that the invention be limited except as provided by the appended claims.

What is claimed is:

1. A method for selectively removing portions of an etchable material comprising:

forming a layer of polyimide on the etchable material;

patterning said layer of polyimide to expose portions of the etchable material;

etching the etchable material using vapor hydrogen fluoride in accordance with a pattern defined by said layer of polyimide; and removing said layer of polyimide.

2. The method of claim 1 wherein patterning said layer of polyimide comprises:

forming a layer of photoresist over said layer of polyimide;

selectively exposing said layer of photoresist;

removing portions of said layers of photoresist and polyimide to define said pattern; and stripping said layer of photoresist.

3. The method of claim 1 wherein patterning said layer of polyimide comprises:

selectively exposing said layer of polyimide; and developing said layer of polyimide to define said pattern.

4. The method of claim 1 wherein removing said layer of polyimide comprises subjecting said layer of polyimide to a polyimide stripper.

5. The method of claim 1 wherein etching the etchable material comprises the use of $N_2$ gas and vapor $H_2O$.

6. The method of claim 1 wherein said etchable material is etched to a depth of greater than 4000 angstroms.

7. The method of claim 6 wherein said etchable material is etched to a depth of at least 8000 angstroms.

8. A method for selectively removing portions of an etchable material comprising:

cleaning the etchable material;

forming a layer of polyimide over the etchable material;

forming a layer of photoresist over said layer of polyimide;

patterning said layer of photoresist;

patterning said layer of polyimide in accordance with said layer of patterned photoresist and thereby uncovering portions of the etchable material; and exposing said layer of polyimide and said uncovered portions of etchable material to vapor hydrogen fluoride.

9. The method of claim 8 wherein forming said layer of polyimide comprises spin coating said layer of polyimide over the etchable material at a spin speed of at least 2300 rpm.

10. The method of claim 9 wherein said exposing step has a duration of less than 20 seconds.

11. A method for selectively removing portions of an etchable material comprising:

forming a layer of polyimide on the etchable material;

patterning said layer of polyimide to expose portions of the etchable material;

etching the etchable material in accordance with a pattern defined by said layer of polyimide, said etching including:

purging the etchable material with $N_2$ gas;

pretreating the etchable material with $N_2$ gas and vapor $H_2O$; and exposing the etchable material to a combination of $N_2$ gas, vapor $H_2O$ and vapor hydrogen fluoride; and removing said layer of polyimide.

12. The method of claim 11 wherein removing said layer of polyimide comprises subjecting said layer of polyimide to a polyimide stripper.

13. A method comprising:

providing an etchable material;

forming a layer of polyimide over the etchable material, the polyimide layer covering a first portion of the etchable material, a second portion of the etchable material not being covered by the polyimide layer;

exposing the polyimide layer and the second portion of the etchable material to vapor hydrogen fluoride, the vapor hydrogen fluoride etching the second portion of the etchable material, the polyimide layer preventing the vapor hydrogen fluoride from etching the first portion of the etchable material.

14. A method according to claim 13, wherein forming a layer of polyimide over the etchable material comprises covering the first and second portions of the etchable material with polyimide and then removing portions of the polyimide over the second portion of the etchable material.

15. A method according to claim 13, further comprising covering portions of the polyimide overlying the first portion of the etchable material with photoresist.

* * * * *